(12) United States Patent
Yang et al.

(10) Patent No.: US 7,157,299 B2
(45) Date of Patent: Jan. 2, 2007

(54) NANOFABRICATION OF INAS/A1SB HETEROSTRUCTURES

(75) Inventors: Ming-Jey Yang, Silver Spring, MD (US); Chia-Hung Yang, Silver Spring, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 133 days.

(21) Appl. No.: 10/725,257

(22) Filed: Dec. 2, 2003

(65) Prior Publication Data
US 2004/0115848 A1    Jun. 17, 2004

Related U.S. Application Data

(62) Division of application No. 10/320,419, filed on Dec. 17, 2002, now Pat. No. 6,703,639.

(51) Int. Cl.
*H01L 21/00* (2006.01)
(52) U.S. Cl. ........................ 438/47; 438/172; 438/174; 438/718
(58) Field of Classification Search ................ 438/46, 438/47, 172, 174, 718; 977/762
See application file for complete search history.

(56) References Cited

U.S. PATENT DOCUMENTS

| 5,349,214 A | * | 9/1994 | Tehrani et al. ............... 257/192 |
| 5,789,540 A | * | 8/1998 | Krstenansky et al. ........ 530/326 |
| 2002/0119661 A1 | * | 8/2002 | Watanabe et al. ............ 438/691 |
| 2004/0101988 A1 | * | 5/2004 | Roman et al. ................. 438/40 |

* cited by examiner

*Primary Examiner*—M. Wilczewski
*Assistant Examiner*—Toniae M. Thomas
(74) *Attorney, Agent, or Firm*—John J. Karasek; Joseph T. Grunkemeyer

(57) ABSTRACT

A heterostructure comprising: a buffer layer; a bottom barrier layer formed on the buffer layer; a quantum well layer formed on the bottom barrier layer; a top barrier layer formed on the quantum well layer; and a p-doped cap layer formed on the top barrier layer; wherein a portion of the cap layer is etched to form conducting electrons in the quantum well layer below the etched portion of the cap layer. A method of etching comprising the steps of: providing a heterostructure; providing an etchant solution comprising acetic acid, hydrogen peroxide, and water; and contacting the etchant solution to the heterostructure to etch the heterostructure.

10 Claims, 2 Drawing Sheets

NANOFABRICATION OF INAS/AlSB HETEROSTRUCTURES

This application is a divisional application of U.S. patent application Ser. No. 10/320,419 filed on Dec. 17, 2002 now U.S. Pat. No. 6,703,639.

BACKGROUND OF THE INVENTION

1. Field of the Invention

The present invention relates to a heterostructure manufacturing method and device and, more particularly, to the nanofabrication of heterostructure devices.

2. Description of the Prior Art

Rapidly developing nanofabrication technologies such as electron-beam (e-beam) and atomic-force-microscope (AFM) lithography and a variety of growth/synthesis techniques have enabled a number of material systems to exhibit mesoscopic phenomena. Some of these systems include metallic wires/rings, carbon nanotubes, and GaAs/AlGaAs heterostructures. Among these, the GaAs/AlGaAs system is the most intensively studied due to the long mean free path ($l_e$) of two-dimensional (2D) electrons in heterojunctions. As a result, it is possible with current technology to fabricate ballistic one-dimensional (1D) wires, where $W<L<l_e$ and W and L are the lateral confinement dimension of the device, i.e., width and length, respectively. The lateral confinement can be accomplished by a number of methods, e.g., mesa-etch or split-gate approaches. However, due to mid-gap pinning of the surface Fermi level ($E_f^s$) in the GaAs/AlGaAs system, electrons are completely depleted in heterojunctions whose metallurgical width ($W_m$) is narrower than 0.5 μm or so. Recently, a number of variations on nanofabrication, e.g., AFM anodization and front-gate induction, have been attempted to further reduce device dimensions.

The 2D electrons in InAs quantum wells (QW's) are also known to have a long mean free path. In addition, InAs has a number of properties that are advantageous for nanofabrication and for studying low-dimensional physics. First, the surface Fermi level pinning position in InAs, $E_f^s$ (InAs), is above the conduction band. This property makes it possible to fabricate isolated conducting wires with widths in nanometers, which suggests the possibility of fabricating a complex circuit with compact dimensions. Second, a small electron effective mass (0.023 $m_0$) results in a large quantization energy, which is favorable for the observation of low-dimensional phenomena at higher temperatures. Finally, the relatively large Lande g-factor ($g_0=-15$) is essential for studying spin related physics, e.g., Berry's phase resulting from the Rashba effect.

Although nanotechnology is a rapidly evolving field, current InAs nanofabrication is limited. For example, nanotechnology fabrication has been used to form InAs conducting wires and rings as well as double-barrier-tunneling dots with a minimum dimension of 30 nm using e-beam lithography and reactive-ion etching (RIE). However, these InAs devices have been limited in applicability for particular applications since the electron beam free path decreases as the wire width is reduced due to damage on the side wall and the top surface during dry etching and $O_2$ ashing. Further, using prior nanofabrication techniques, ultra smallness is obtained at the expense of material quality, which is a drawback for practical applications.

Previous attempts of overcoming the aforementioned limitations of these manufacturing methods and resulting InAs devices, namely limitations due to side wall and top surface damage, includes the use of chemical etching which typically results in minimal damage. Using conventional chemical etching techniques and etchant solutions, a 20 nm depth wet etch can provide isolation of InAs wires. However, the marginal control of side wall roughness characteristic of this method, limits application of the method for deep submicron device fabrication. Generally speaking, the deeper the etched pattern, the rougher the side wall will be. As a result, chemical etching is rarely applied to nanofabrication. Moreover, lateral isolation by the physical isolation of an InAs quantum well may not be the ideal choice since the conducting electrons will be in close proximity to the surface states and may suffer from excess scattering.

SUMMARY OF THE INVENTION

The present invention concerns a heterostructure device and manufacturing method that provides for nanofabrication of heterostructure devices including quantum wells. These heterostructure devices may be used for conducting wires commonly referred to as quantum wires. The device is formed from a suitable substrate having a quantum well formed therein, barrier layers located above and below the quantum well, and a cap layer formed on the top barrier layer, in which the cap layer is a p-doped material which provides the requisite depletion of 2D electrons from the quantum well.

Chemical etching is conducted using an appropriate etchant to form the desired structure depending on the substrate to be etched. Appropriate etchants include (1) acetic acid and hydrogen peroxide to etch InAs; and (2) hydrogen fluoride, hydrogen peroxide and lactic acid; and (3) AZ400K to etch AlSb, GaSb and their alloys.

According to one aspect of the present invention, a heterostructure comprises a buffer layer and a bottom barrier layer formed on the buffer layer. A quantum well layer is formed on the bottom barrier layer. A top barrier layer is then formed on the quantum well layer. A p-doped cap layer is formed on the top barrier layer. A portion of the cap layer is etched to form conducting electrons in the quantum well layer below the etched portion of the cap layer.

According to another aspect of the present invention, a heterostructure comprises an $Al_xGa_{1-x}Sb$ buffer layer and an $Al_xGa_{1-x}Sb$ bottom barrier layer formed on the buffer layer. An InAs quantum well layer is formed on the bottom barrier layer. An $Al_xGa_{1-x}Sb$ top barrier layer is formed on the quantum well layer and a cap comprising a first InAs cap layer, an $Al_xGa_{1-x}Sb$ cap layer, and a second InAs cap layer is formed on the top barrier layer. The second InAs cap layer is etched to form conducting electrons in the quantum well layer below the etched portion of the second InAs cap layer.

According to another aspect of the present invention, a method of fabricating a heterostructure device includes providing a buffer layer and growing a bottom barrier layer on the buffer layer. A quantum well layer is grown on the bottom barrier layer and a top barrier layer is grown on the quantum well layer. A p-doped cap layer is formed on the top barrier layer. A portion of the cap layer is etched to form conducting electrons in the quantum well layer below the etched portion of the cap layer According to yet another aspect of the present invention, an etching method is provided which includes providing a heterostructure and providing an etchant solution comprising acetic acid, hydrogen peroxide, and water. The etchant solution in contacted to the heterostructure to etch the heterostructure.

According to further aspect of the present invention, an etching method is provided which includes providing a heterostructure and providing an etchant solution comprising hydrofluoric acid, hydrogen peroxide, and lactic acid. The etchant solution in contacted to the heterostructure to etch the heterostructure.

According to another aspect of the present invention, an etching method is provided which includes providing an $Al_xGa_{1-x}Sb$ heterostructure and providing an etchant solution comprising AZ400K and water. The etchant solution in contacted to the heterostructure to etch the heterostructure.

Further features and advantages of the present invention will be set forth in, or apparent from, the detailed description of preferred embodiments thereof which follows.

DETAILED DESCRIPTION OF THE PREFERRED EMBODIMENTS

Figure 1:
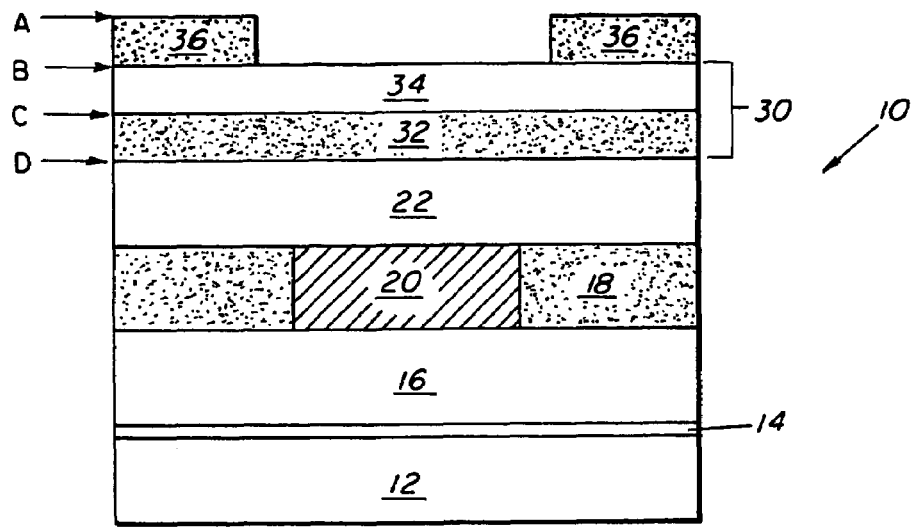
FIG. 1 is a schematic depicting a heterostructure device in accordance with the present invention.

The present heterostructure device and manufacturing method are described herein with reference to nanofabrication of an InAs/AlSb single quantum well (QW) system such as heterostructure device 10 depicted in FIG. 1. Device 10 includes a 2 μm undoped $Al_xGa_{1-x}Sb$ buffer layer 12, a GaSb/AlSb smoothing lattice 14, a 100 nm AlSb bottom barrier layer 16, a 17 nm InAs quantum well layer 18 with a quantum well 20 therein, a 25 nm AlSb top barrier layer 22, and a p-doped cap 30 comprising a bottom InAs cap layer 32, AlSb cap layer 34 and top InAs cap layer 36.

Device 10 is fabricated to have minimal 2D electrons in the quantum well 20. The reduction in 2D electrons is provided by a low $E_f^s$ InAs quantum well layer 18 and the p-doped cap 30. In an effort to minimize the effect of 2D electrons which may be present in the quantum well 20 resulting from unintentional doping of the quantum well, and to compensate for the n-doping contribution from surface states, the three cap layers 32, 34, 36 are intentionally doped with Be at $10^{19}$ $cm^{-3}$. Although device 10 includes cap 30 comprising three cap layers 32, 34, 36, alternative embodiments may include a single cap layer, i.e., only cap layer 32.

These layers are grown on the buffer layer 12, according to methods known in the art. This is followed by etching of a portion of the cap layer, according to methods disclosed herein as well as by other methods known in the art. The etching can be done by photolithographic or e-beam lithographic imaging. The etching causes conducting electrons to form in the quantum well 20 in an area below the etched region. Electrons in the quantum well 20 cannot pass into the rest of the quantum well layer 18, the bottom barrier layer 16, or the top barrier layer 22. The etching pattern can be designed such that the quantum well 20 is a quantum wire, a circuit, or any other pattern.

EXAMPLE

A further description of the present invention is provided by the following non-limiting example that in no way affects the scope of the invention. In the following example, a heterostructure device 10 of FIG. 1 is grown on a semi-insulating (001) GaAs substrate 12 by molecular beam epitaxy with cracked As and Sb sources. Hall bars are fabricated in the heterostructure device using photolithography.

The etching solutions used during the photolithography etching are selected to provide control over etching parameters, which include etching time, etching temperature, and the amount of etching. Further, the etching solution composition and its concentration are selected to provide the desired etching effect.

Three advantageous etchant solutions which provide highly selective etching include (I) acetic acid:$H_2O_2$:$H_2O$ for InAs; and (II) HF:$H_2O_2$:lactic acid and (III) AZ400K:$H_2O$ for AlSb, GaSb and their alloys. AZ400K is a known commercial developer not previously used to etch AlSb, GaSb, and their alloys. The preferable etchant ratios, by volume, are provided in the Table 1.

TABLE 1

| Etchant Solution | Constituents | Ratios | Etchant material |
| --- | --- | --- | --- |
| I | acetic acid:$H_2O_2$:$H_2O$ | 5:10:100 to 5:10:200 | InAs |
| II | HF:$H_2O_2$:lactic acid | 5:10:100 to 5:10:200 | $Al_xGa_{1-x}Sb$ |
| III | AZ400K:$H_2O$ | 1:4 | $Al_xGa_{1-x}Sb$ |

Etching times vary depending on the etchant solution, the material, layer thickness, and etching temperature to achieve the desired etching effect. In general, the InAs etching rate with solution I is about 15–25 Å/s at room temperature, the AlSb etching rate with solution II is about 15–30 Å/s, and the AlSb etching rate with AZ400K is about 30 Å/s, based on the constituent ratios in Table 1.

In this example, solution I and solution II are used on the appropriate heterostructure layer to produce different terminating surfaces for three Hall bars, referred to as samples B, C and D, corresponding to surfaces B–D in FIG. 1.

Figure 3:
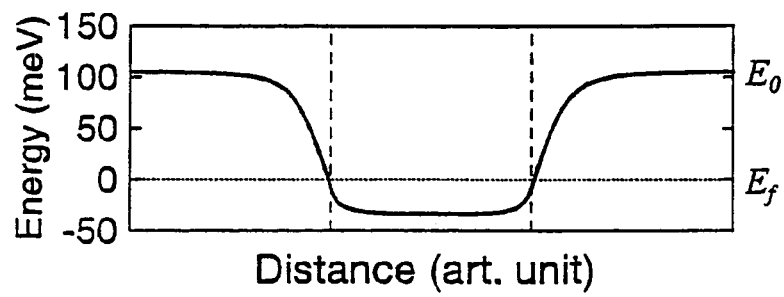
FIG. 3 a schematic diagram of the lateral confinement potential for sample B.

Bonding pads are defined by a second photolithography level, where all the cap layers 32, 34, 36 and the top AlSb barrier 22 are etched off, followed by metal evaporation on the InAs QW surface and lift-off. FIG. 3 displays a schematic diagram of the lateral confinement potential for sample B. The exact profile requires a 2D self-consistent calculation and an understanding of the detailed impurity concentrations in each layer.

To characterize these three Hall bars, magnetotransport measurements are carried out at 4.2 K using a conventional four-terminal lock-in technique with a current range of 10–100 nA at 17 Hz. As predicted, sample C is highly resistive, however, not insulating. The resistivity is measured to be >200 kΩ-cm.

Both samples B and D exhibit zero $\rho_{xx}$ and a quantum plateau in $\rho_{xy}$ at integer filling factors, indicating a well defined lateral confinement for edge current. The 2D electron density and mobility for sample B are found to be $4.9 \times 10^{11}$ $cm^{-2}$ and $2.0 \times 10^5$ $cm^2/Vs$, respectively, corresponding to $l_e$=2.3 μm. By comparison, both density and mobility are roughly doubled in sample D, $1.1 \times 10^{12}$ $cm^{-2}$ and $4.3 \times 10^5$ $cm^2/Vs$, leading to $l_e$=7.5 μm. The obtained densities imply Fermi energies of 43 meV and 88 meV, respectively. These values are in good agreement with a band bending calculation, discussed in greater detail below, indicating that the parameters assumed in the calculation, such as impurity concentration and $E_f^s$ are realistic.

Figure 2A:
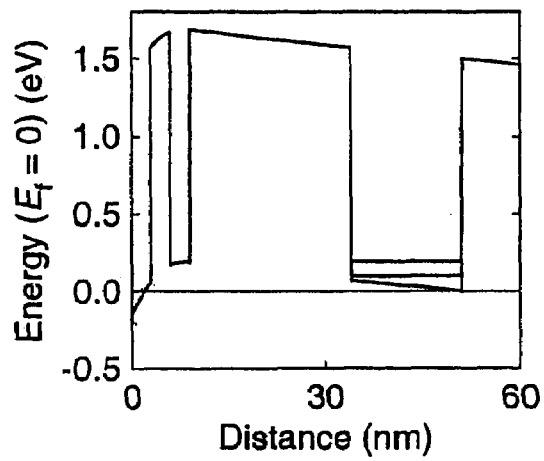
FIG. 2(A)–FIG. 2(D) are plots of the electrical conductivity of various heterostructure devices in accordance with the present invention.

To provide further understanding of the present device, reference is made to the plots of FIG. 2 where FIG. 2(a) plots the self-consistent band bending. In FIG. 2(a), it is assumed that the Be binding energies in InAs and AlSb are 20 meV and 38 meV, respectively, a donor concentration of $4 \times 10^{16}$ cm$^{-3}$, and an acceptor concentration of $5 \times 10^{16}$ cm$^{-3}$ in unintentionally doped AlSb barriers. The acceptor binding energy is assumed to be 0.4 eV above the AlSb valence band maximum and $E_f^s$ (InAs) is assumed to be 0.15 eV above the conduction band minimum of the InAs cap. As shown in FIG. 2(a), the lowest (second) sub-band energy, $E_0$ ($E_1$) is calculated to be 100 meV (190 meV) above the Fermi level ($E_f$); i.e., the as-grown sample should be barrier.

Figure 2B:
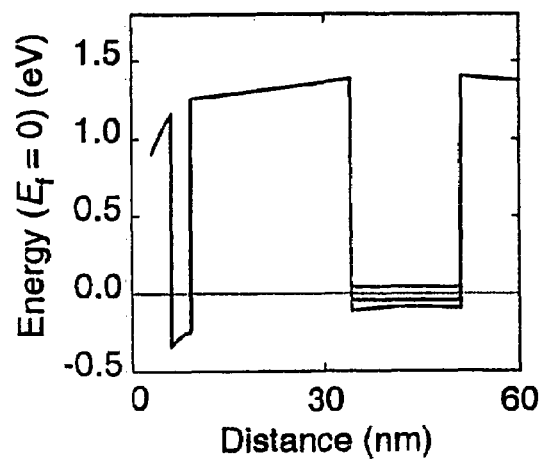
Figure 2C:
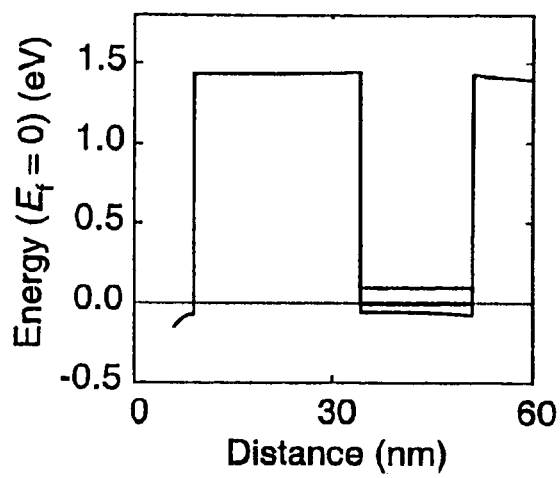
Figure 2D:
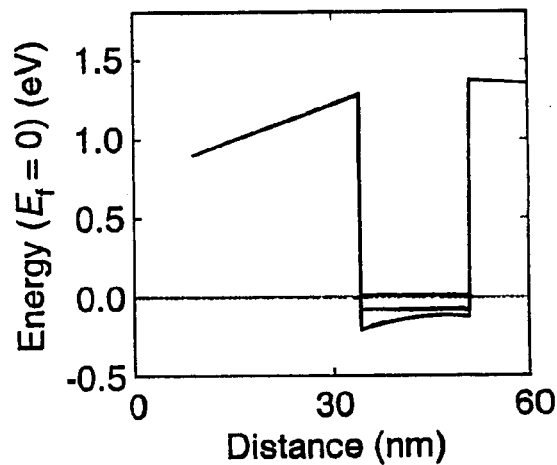

Drastic changes in electron density in the InAs QW occur when the three cap layers 32, 34, and 36 are removed sequentially. FIGS. 2(A)–(D) plot the self-consistent band bending for samples with different terminated layers, corresponding to the situation where the device terminates at the respective cap surface labeled A–D in FIG. 1. When the top InAs cap layer 36 is removed, leaving cap surface B, the sample is terminated with the 3 nm thick AlSb cap layer 34. In this case, not only is the total Be dopant reduced, but most importantly, $E_f^s$ is shifted upward due to a relatively high pinning position in AlSb surface. Combining these two effects brings the $E_f$ above $E_0$ by 40 meV, as shown in FIG. 2(B). Here it is assumed that $E_f^s$ (AlSb) is pinned at 0.75 eV above the AlSb valence band maximum. Since the InAs conduction band minimum is 0.15 eV above the AlSb valence band maximum, $E_f^s$ is effectively changed by 0.45 eV when the 3 nm thick InAs cap is removed. Thus, a change of surface material is equivalent to applying +0.45 eV to a top-gate relative to the substrate. As a result, electrons are induced in the InAs QW underneath the etched region. If the subsequent 3 nm-thick AlSb cap is further removed, the top-most material is InAs again (surface-C), and $E_f^s$ is pinned back to a lower position. As plotted in FIG. 2(C), $E_f$ now lies just slightly below $E_0$. Compared to FIG. 2(A), the smaller separation between $E_0$ and $E_f$ is mainly due to a reduced total Be dopant. When the last doped InAs layer is eliminated (surface-D), its band bending, plotted in FIG. 2(D), becomes similar to that of the surface-B. However, due to the absence of p-dopant and a closer distance of the InAs QW to the surface, $E_f$ now lies further above $E_0$. Calculation predicts that $E_f - E_0 = 90$ meV.

As will now be apparent to one of ordinary skill in the art, the present heterostructure device and nanotechnology fabrication process provide advantages and features previously not found in the art and, in particular, in InAs nanofabrication. As previously noted, prior nanofabrication methods, and in particular, ones which use chemical etching, are limited in application in that in these prior chemical etching methods there is marginal control of side wall roughness, thereby limiting the use of chemical etching in deep sub-micron device fabrication. However, using the chemical etching method in accordance with the present nanofabrication method provides the necessary etching control for fabricating desired heterostructure devices.

An advantage of the present fabrication method is that no additional surface states are created. In addition, the edge of the 1D electrons is defined by the electrostatic potential. Consequently, the electron mean free path is expected to be insensitive to the wire width and the material quality will not be degraded by the additional lateral confinement.

In addition, the present method provides a simple, yet flexible method, which allows for creation of novel nanostructures such as dots with diameters of 16 nm or less which contain only one electron.

Further, the structures described herein can be modified so that the starting density can be lower after the shallow wet etching. The present technique may be adapted to various semiconductor heterostructures using the proper combination of cap layers, including silicon-based nanostructures such as miniature MOSFET (metal-oxide-semiconductor field effect transistor). The present chemical etching method can be adapted for use in other semiconductor manufacturing processes as should now be apparent to those of ordinary skill in this art. Alternatively, the present method may be adapted to fabricate a number of nanostructures by electron-beam lithography using PMMA as the etching mask.

Although the invention has been described above in relation to preferred embodiments thereof, it will be understood by those skilled in the art that variations and modifications can be effected in these preferred embodiments without departing from the scope and spirit of the invention.

We claim:

1. A method of fabricating a heterostructure device, the method comprising the steps of:
   providing a buffer layer;
   growing a bottom barrier layer on the buffer layer;
   growing a quantum well layer on the bottom barrier layer;
   growing a top barrier layer on the quantum well layer;
   forming a p-doped cap layer on the top barrier layer; and
   etching a portion of the cap layer to form conducting electrons in the quantum well layer below the etched portion of the cap layer.

2. The method of claim 1, wherein the buffer layer comprises $Al_xGa_{1-x}Sb$, the bottom barrier layer comprises $Al_xGa_{1-x}Sb$, the quantum well layer comprises InAs, and the top barrier layer comprises $Al_xGa_{1-x}Sb$.

3. The method of claim 1, wherein a smoothing lattice comprising GaSb/AlSb is disposed between the buffer layer and the bottom barrier layer.

4. The method of claim 1, wherein the cap layer comprises no more than one p-doped InAs cap layer.

5. The method of claim 1, wherein the step of forming a p-doped cap layer comprises the step of forming alternating layers of p-doped material having differing $E_f^s$ values.

6. The method of claim 1, wherein the cap layer comprises a first p-doped InAs cap layer, a p-doped $Al_xGa_{1-x}Sb$ cap layer and a second p-doped InAs cap layer.

7. The method of claim 6, wherein the etching step comprises etching the second InAs cap layer.

8. The method of claim 7, wherein the etching is performed using a solution comprising acetic acid, hydrogen peroxide, and water.

9. The method of claim 7, wherein the etching step further comprises etching portions of the $Al_xGa_{1-x}Sb$ cap layer and the first InAs cap layer.

10. The method of claim 9, wherein the etching of the $Al_xGa_{1-x}Sb$ cap layer is performed using either a solution comprising hydrofluoric acid, hydrogen peroxide, and lactic acid or a solution comprising AZ400K and water, and the etching of the first InAs cap layer is performed using a solution comprising acetic acid, hydrogen peroxide and water.

* * * * *